(12) United States Patent
Tschinderle et al.

(10) Patent No.: US 10,056,287 B2
(45) Date of Patent: Aug. 21, 2018

(54) APPARATUS FOR TREATING SURFACES OF WAFER-SHAPED ARTICLES

(71) Applicant: LAM RESEARCH AG, Villach (AT)

(72) Inventors: Ulrich Tschinderle, Feistritz/Gail (AT);
Andreas Gleissner, Radenthein (AT);
Thomas Wirnsberger, Seeboden (AT);
Rainer Obweger, Lind im Drautal (AT)

(73) Assignee: LAM RESEARCH AG, Villach (AT)

(*) Notice: Subject to any disclaimer, the term of this patent is extended or adjusted under 35 U.S.C. 154(b) by 0 days.

(21) Appl. No.: 14/871,927

(22) Filed: Sep. 30, 2015

(65) Prior Publication Data
US 2016/0027680 A1    Jan. 28, 2016

Related U.S. Application Data

(62) Division of application No. 13/228,980, filed on Sep. 9, 2011.

(51) Int. Cl.
*H01L 21/67* (2006.01)
*H01L 21/687* (2006.01)

(52) U.S. Cl.
CPC .... *H01L 21/68785* (2013.01); *H01L 21/6708* (2013.01); *H01L 21/6719* (2013.01); *H01L 21/67023* (2013.01); *H01L 21/67051* (2013.01); *Y10T 279/3493* (2015.01)

(58) Field of Classification Search
None
See application file for complete search history.

(56) References Cited

U.S. PATENT DOCUMENTS

| 4,448,799 A | * | 5/1984 | Bergman | C23C 14/325 118/50.1 |
| 4,903,717 A |   | 2/1990 | Sumnitsch | |
| 5,156,174 A | * | 10/1992 | Thompson | H01L 21/6708 134/153 |
| 5,352,898 A | * | 10/1994 | Mehta | G01N 1/286 250/304 |

(Continued)

FOREIGN PATENT DOCUMENTS

| CN | 101207010 A | 6/2008 |
| CN | 102893372 A | 1/2013 |

(Continued)

OTHER PUBLICATIONS

C. Otto Gehrckens GmbH & Co. KG, "O-ring basics," 2007 pp. 1-34.*

(Continued)

*Primary Examiner* — Jeffrie R Lund
*Assistant Examiner* — Stanislav Antolin

(57) ABSTRACT

A device for processing wafer-shaped articles comprises a closed process chamber. The closed process chamber comprises a housing providing a gas-tight enclosure, a rotary chuck located within the closed process chamber and adapted to hold a wafer shaped article thereon, and an interior cover disposed within said closed process chamber. The interior cover is movable between a first position in which the rotary chuck communicates with an outer wall of the closed process chamber, and a second position in which the interior cover seals against an inner surface of the closed process chamber adjacent the rotary chuck to define a gas-tight inner process chamber.

19 Claims, 5 Drawing Sheets

(56) References Cited

U.S. PATENT DOCUMENTS

| | | | |
|---|---|---|---|
| 5,472,502 A | 12/1995 | Batchelder | |
| 5,513,668 A | 5/1996 | Sumnitsch | |
| 5,626,913 A * | 5/1997 | Tomoeda | G03F 7/162 |
| | | | 396/611 |
| 5,762,708 A * | 6/1998 | Motoda | B05C 11/08 |
| | | | 118/319 |
| 5,772,770 A | 6/1998 | Suda et al. | |
| 6,100,618 A | 8/2000 | Schoeb et al. | |
| 6,139,682 A * | 10/2000 | Iwata | H01L 21/68742 |
| | | | 118/500 |
| 6,153,012 A * | 11/2000 | Rupp | C23C 16/4584 |
| | | | 118/620 |
| 6,190,104 B1 * | 2/2001 | Ikeda | H01L 21/67742 |
| | | | 414/217 |
| 6,221,781 B1 | 4/2001 | Siefering et al. | |
| 6,485,531 B1 | 11/2002 | Schob | |
| 6,680,253 B2 | 1/2004 | Wirth et al. | |
| 6,810,888 B2 | 11/2004 | Tsuchiya et al. | |
| 6,874,516 B2 | 4/2005 | Matsuno et al. | |
| 7,585,686 B2 | 9/2009 | Verhaverbeke et al. | |
| 8,485,204 B2 | 7/2013 | Obweger et al. | |
| 9,209,049 B2 | 12/2015 | Sorabji et al. | |
| 2002/0046810 A1 * | 4/2002 | Tanaka | C23C 16/4401 |
| | | | 156/345.51 |
| 2002/0157960 A1 * | 10/2002 | Dordi | C25D 21/00 |
| | | | 205/143 |
| 2003/0005948 A1 | 1/2003 | Matsuno et al. | |
| 2003/0010671 A1 | 1/2003 | Orii et al. | |
| 2003/0056814 A1 * | 3/2003 | Kuntz | H01L 21/67057 |
| | | | 134/137 |
| 2003/0079835 A1 * | 5/2003 | Kajino | C03C 15/00 |
| | | | 156/345.11 |
| 2003/0230854 A1 * | 12/2003 | Kim | H01L 21/67126 |
| | | | 277/549 |
| 2004/0182316 A1 | 9/2004 | Watanabe | |
| 2005/0260345 A1 | 11/2005 | Lubomirsky et al. | |
| 2006/0151014 A1 * | 7/2006 | Obweger | H01L 21/67051 |
| | | | 134/94.1 |
| 2006/0269686 A1 | 11/2006 | Lin et al. | |
| 2007/0000527 A1 | 1/2007 | Aegerter et al. | |
| 2007/0022948 A1 * | 2/2007 | Rose | H01L 21/67017 |
| | | | 118/52 |
| 2008/0014358 A1 * | 1/2008 | Koo | H01L 21/67028 |
| | | | 427/372.2 |
| 2008/0057219 A1 * | 3/2008 | Kim | H01L 21/67051 |
| | | | 427/534 |
| 2008/0142051 A1 | 6/2008 | Hashizume | |
| 2008/0271763 A1 | 11/2008 | Collins et al. | |
| 2009/0038641 A1 * | 2/2009 | Matsumoto | H01L 21/02087 |
| | | | 134/6 |
| 2009/0079122 A1 * | 3/2009 | Obweger | H01L 21/67051 |
| | | | 269/57 |
| 2010/0101424 A1 | 4/2010 | Hohenwarter | |
| 2011/0008740 A1 | 1/2011 | Sorabji et al. | |
| 2011/0240220 A1 | 10/2011 | Schoeb | |
| 2011/0250044 A1 | 10/2011 | Obweger et al. | |
| 2011/0290283 A1 | 12/2011 | Obweger et al. | |
| 2013/0101372 A1 | 4/2013 | Tschinderle et al. | |
| 2013/0125379 A1 | 5/2013 | Plazonic et al. | |
| 2013/0134128 A1 | 5/2013 | Tschinderle et al. | |
| 2013/0160260 A1 | 6/2013 | Frank et al. | |

FOREIGN PATENT DOCUMENTS

| | | | |
|---|---|---|---|
| EP | 0986162 | 3/2000 | |
| WO | 9631934 | 10/1996 | |
| WO | 2007/101764 | 9/2007 | |
| WO | WO 2008071517 A1 * | 6/2008 | G03F 7/162 |
| WO | 2010070562 | 6/2010 | |

OTHER PUBLICATIONS

"Sealing Elements: Technical Handbook O-rings." pp. 1-21, 47-59, 93, & 131-161. Apr. 2013. Source location: Eriks N.V., http://eriks.info/en/home/. Available: http://o-ring.info/en/downloads/technical-handbook/. Accessed: Dec. 18, 2015.*

International Search Report, dated Feb. 1, 2013, from corresponding PCT application.

Chinese Search Report, dated Feb. 22, 2016, from corresponding Chinese application.

* cited by examiner

APPARATUS FOR TREATING SURFACES OF WAFER-SHAPED ARTICLES

BACKGROUND OF THE INVENTION

1. Field of the Invention

The invention relates generally to an apparatus for treating surfaces of wafer-shaped articles, such as semiconductor wafers, wherein one or more treatment fluids may be recovered from within a closed process chamber.

2. Description of Related Art

Semiconductor wafers are subjected to various surface treatment processes such as etching, cleaning, polishing and material deposition. To accommodate such processes, a single wafer may be supported in relation to one or more treatment fluid nozzles by a chuck associated with a rotatable carrier, as is described for example in U.S. Pat. Nos. 4,903,717 and 5,513,668.

Alternatively, a chuck in the form of a ring rotor adapted to support a wafer may be located within a closed process chamber and driven without physical contact through an active magnetic bearing, as is described for example in International Publication No. WO 2007/101764 and U.S. Pat. No. 6,485,531. Treatment fluids which are driven outwardly from the edge of a rotating wafer due to centrifugal action are delivered to a common drain for disposal.

Although conventional closed process chambers adequately contain the hazardous substances used for wafer processing while the chamber is closed, they must be opened for loading and unloading of wafers. This causes a significant risk that process gas, chemical fumes, hot vapor such as vaporized isopropyl alcohol, ozone and the like could be released to the tool environment, which could result in significant safety risks and damage to surrounding components and tools.

SUMMARY OF THE INVENTION

The present inventors have developed an improved closed process chamber for treating wafer-shaped articles, in which an inner chamber is provided within an outer chamber, with each of the inner and outer chambers being configured to provide a gas-tight enclosure.

Thus, the invention in one aspect relates to a device for processing wafer-shaped articles, comprising a closed process chamber. The closed process chamber comprises a housing providing a gas-tight enclosure, a rotary chuck located within the closed process chamber and adapted to hold a wafer shaped article thereon, and an interior cover disposed within said closed process chamber. The interior cover is movable between a first position in which the rotary chuck communicates with an outer wall of the closed process chamber, and a second position in which the interior cover seals against an inner surface of the closed process chamber adjacent the rotary chuck to define a gas-tight inner process chamber. Preferably said movement between the first position and the second position is an axial movement along the rotational axis of rotary chuck.

In preferred embodiments of the device according to the present invention, the interior cover forms a lower portion of the inner process chamber when in the second position.

In preferred embodiments of the device according to the present invention, the interior cover comprises a base and at least one upstanding wall, the base being connected to a shaft that penetrates the closed process chamber via a seal that permits relative movement between the shaft and the closed process chamber while maintaining gas tightness of the outer process chamber. Preferably said relative movement is an axial movement along the rotational axis of rotary chuck.

In preferred embodiments of the device according to the present invention, at least one process fluid collector is formed in a lower portion of the interior cover, the process fluid collector communicating with a discharge pipe depending from the interior cover that penetrates the closed process chamber via a seal that permits relative movement between the discharge pipe and the closed process chamber while maintaining gas tightness of the outer process chamber.

In preferred embodiments of the device according to the present invention, the closed process chamber comprises independently controlled exhaust ports, a first exhaust port opening into the closed process chamber in a region inside the inner chamber when the interior cover is in the second position, and a second exhaust port opening into the closed process chamber in a region outside the inner chamber when the interior cover is in the second position.

In preferred embodiments of the device according to the present invention, the interior cover comprises a plurality of splash guards that are independently axially displaceable relative to the interior cover, the splash guards and the interior cover being adapted to define a plurality of distinct processing regions within the inner chamber when the interior cover is in the second position.

In preferred embodiments of the device according to the present invention, each of the distinct processing regions comprises a respective liquid discharge pipe in fluid communication therewith.

In preferred embodiments of the device according to the present invention, each axially displaceable splash guard is selectively driven from outside the closed process chamber to a predefined vertical position.

In preferred embodiments of the device according to the present invention, each axially displaceable splash guard is selectively positionable so as to capture a preselected process fluid emanating from a spinning wafer carried by the rotary chuck.

In preferred embodiments of the device according to the present invention, the rotary chuck is adapted to be driven without physical contact through a magnetic bearing, and the rotary chuck and the interior cover are vertically movable relative to each other.

In preferred embodiments of the device according to the present invention, the magnetic bearing comprises a stator located outside the closed process chamber.

In preferred embodiments of the device according to the present invention, the magnetic bearing is selectively positionable such that a preselected process fluid emanating from a spinning wafer carried by the rotary chuck is directed to a preselected fluid collector.

In preferred embodiments of the device according to the present invention, the magnetic bearing is an active magnetic bearing.

In preferred embodiments of the device according to the present invention, the closed process chamber is a module in a station for single wafer wet processing of semiconductor wafers.

In preferred embodiments of the device according to the present invention, the closed process chamber is made of aluminum coated with perfluoroalkoxy resin.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
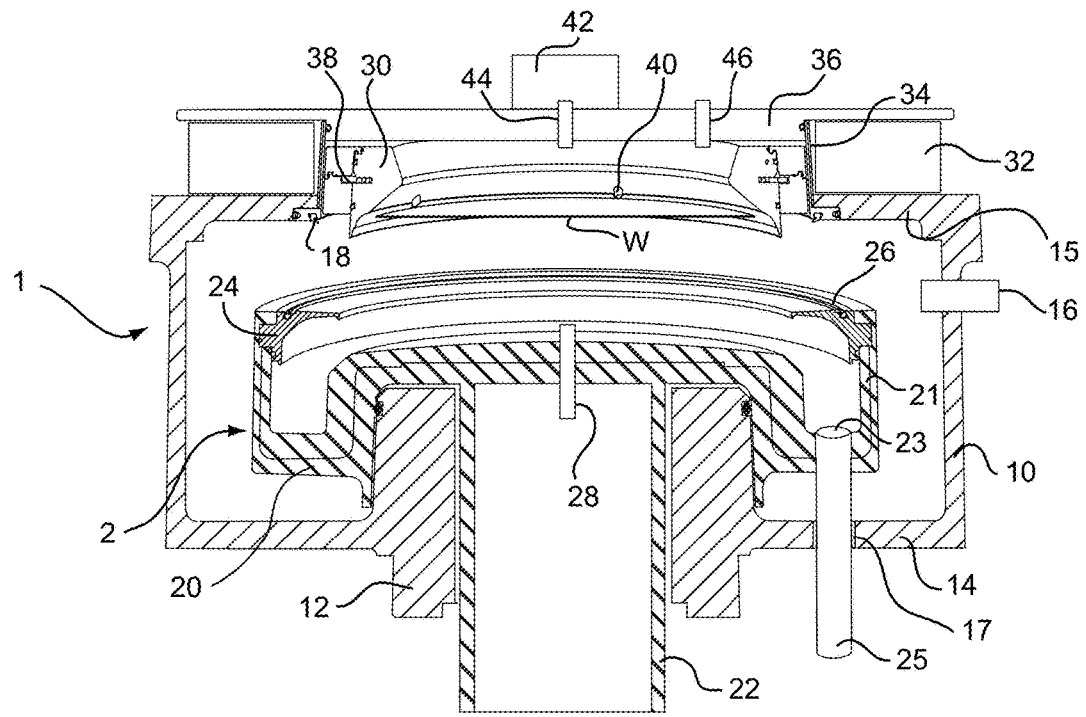
FIG. 1 is an explanatory cross-sectional side view of a process chamber according to a first embodiment of the invention, with the interior cover shown in its first position.

Referring now to FIG. 1, an apparatus for treating surfaces of wafer-shaped articles according to a first embodiment of the invention comprises an outer process chamber 1, which is preferably made of aluminum coated with PFA (perfluoroalkoxy) resin. The chamber in this embodiment has a main cylindrical wall 10, a lower part 12 and an upper part 15. From upper part 15 there extends a narrower cylindrical wall 34, which is closed by a lid 36.

A rotary chuck 30 is disposed in the upper part of chamber 1, and surrounded by the cylindrical wall 34. Rotary chuck 30 rotatably supports a wafer W during used of the apparatus. The rotary chuck 30 incorporates a rotary drive comprising ring gear 38, which engages and drives a plurality of eccentrically movable gripping members for selectively contacting and releasing the peripheral edge of a wafer W.

In this embodiment, the rotary chuck 30 is a ring rotor provided adjacent to the interior surface of the cylindrical wall 34. A stator 32 is provided opposite the ring rotor adjacent the outer surface of the cylindrical wall 34. The rotor 30 and stator 34 serve as a motor by which the ring rotor 30 (and thereby a supported wafer W) may be rotated through an active magnetic bearing. For example, the stator 34 can comprise a plurality of electromagnetic coils or windings that may be actively controlled to rotatably drive the rotary chuck 30 through corresponding permanent magnets provided on the rotor. Axial and radial bearing of the rotary chuck 30 may be accomplished also by active control of the stator or by permanent magnets. Thus, the rotary chuck 30 may be levitated and rotatably driven free from mechanical contact. Alternatively, the rotor may be held by a passive bearing where the magnets of the rotor are held by corresponding high-temperature-superconducting magnets (HTS-magnets) that are circumferentially arranged on an outer rotor outside the chamber. With this alternative embodiment each magnet of the ring rotor is pinned to its corresponding HTS-magnet of the outer rotor. Therefore the inner rotor makes the same movement as the outer rotor without being physically connected.

The lid 36 has a manifold 42 mounted on its exterior, which supplies a medium inlet 44 that traverses the lid 36 and opens into the chamber above the wafer W. It will be noted that the wafer W in this embodiment hangs downwardly from the rotary chuck 30, supported by the gripping members 40, such that fluids supplied through inlet 44 would impinge upon the upwardly facing surface of the wafer W.

In case wafer 30 is a semiconductor wafer, for example of 300 mm or 450 mm diameter, the upwardly facing side of wafer W could be either the device side or the obverse side of the wafer W, which is determined by how the wafer is positioned on the rotary chuck 30, which in turn is dictated by the particular process being performed within the chamber 1.

The apparatus of FIG. 1 further comprises an interior cover 2, which is movable relative to the process chamber 1. Interior cover 2 is shown in FIG. 1 in its first, or open, position, in which the rotary chuck 30 is in communication with the outer cylindrical wall 10 of chamber 1. Cover 2 in this embodiment is generally cup-shaped, comprising a base 20 surrounded by an upstanding cylindrical wall 21. Cover 2 furthermore comprises a hollow shaft 22 supporting the base 20, and traversing the lower wall 14 of the chamber 1.

Hollow shaft 22 is surrounded by a boss 12 formed in the main chamber 1, and these elements are connected via a dynamic seal that permits the hollow shaft 22 to be displaced relative to the boss 12 while maintaining a gas-tight seal with the chamber 1.

At the top of cylindrical wall 21 there is attached an annular deflector member 24, which carries on its upwardly-facing surface a gasket 26. Cover 2 preferably comprises a fluid medium inlet 28 traversing the base 20, so that process fluids and rinsing liquid may be introduced into the chamber onto the downwardly facing surface of wafer W.

Cover 2 furthermore includes a process liquid discharge opening 23, which opens into a discharge pipe 25. Whereas pipe 25 is rigidly mounted to base 20 of cover 2, it traverses the bottom wall 14 of chamber 1 via a dynamic seal 17 so that the pipe may slide axially relative to the bottom wall 14 while maintaining a gas-tight seal.

An exhaust opening 16 traverses the wall 10 of chamber 1, whereas a separate exhaust opening 46 traverses the lid 36 near the inner surface of rotary chuck 30. Each exhaust opening is connected to suitable exhaust conduits (not shown), which are preferably independently controlled via respective valves and venting devices.

The position depicted in FIG. 1 corresponds to loading or unloading of a wafer W. In particular, a wafer W can be loaded onto the rotary chuck 30 either through the lid 36, or, more preferably, through a side door (not shown) in the chamber wall 10. However, when the lid 36 is in position and when any side door has been closed, the chamber 1 is gas-tight and able to maintain a defined internal pressure.

Figure 2:
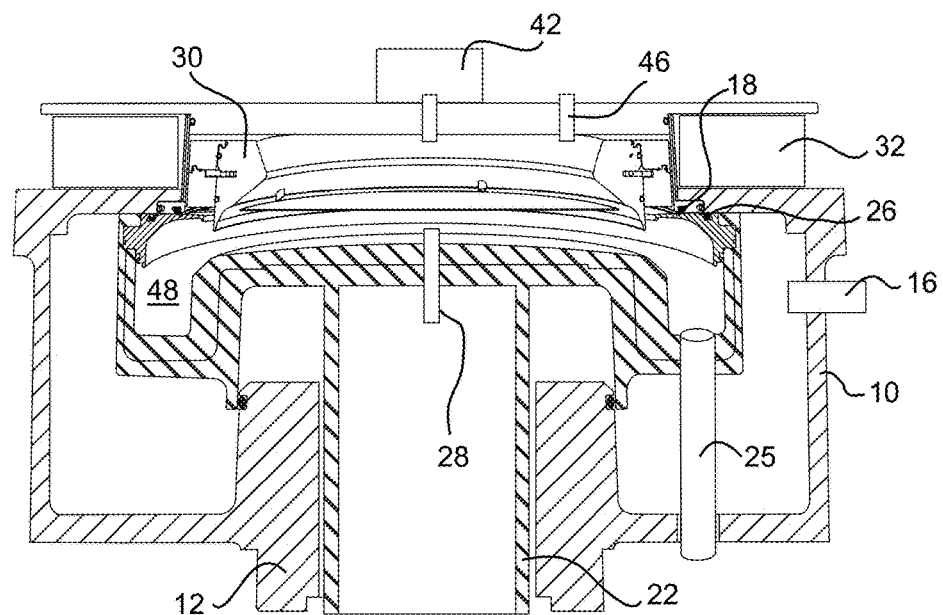
FIG. 2 is an explanatory cross-sectional side view of a process chamber according to the first embodiment of the invention, with the interior cover shown in its second position.

In FIG. 2, the interior cover 2 has been moved to its second, or closed, position, which corresponds to processing of a wafer W. That is, after a wafer W is loaded onto rotary chuck 30, the cover 2 is moved upwardly relative to chamber 1, by a suitable motor (not shown) acting upon the hollow shaft 22. The upward movement of the interior cover 2 continues until the deflector member 24 comes into contact with the interior surface of the upper part 15 of chamber 1. In particular, the gasket 26 carried by deflector 24 seals against the underside of upper part 15, whereas the gasket 18 carried by the upper part 15 seals against the upper surface of deflector 24.

When the interior cover 2 reaches its second position as depicted in FIG. 2, there is thus created a second chamber 48 within the closed process chamber 1. Inner chamber 48 is moreover sealed in a gas tight manner from the remainder of the chamber 1. Moreover, the chamber 48 is preferably separately vented from the remainder of chamber 1, which is achieved in this embodiment by the provision of the exhaust port 46 opening into the chamber 48, independently from the exhaust port 16 that serves the chamber 1 in general, and the remainder of the chamber 1 in the FIG. 2 configuration.

During processing of a wafer, processing fluids may be directed through medium inlets 44 and/or 28 to a rotating wafer W in order to perform various processes, such as etching, cleaning, rinsing, and any other desired surface treatment of the wafer undergoing processing.

Provision of the inner chamber 48 within the overall process chamber 1 thus enhances the safety of environmentally closed chambers by permitting the gases and liquids used for wafer processing to be better isolated from the exterior environment of the process chamber, and reduces the risk of process gas, chemical fumes, hot vapor such as vaporized isopropyl alcohol, ozone and the like being released to the tool environment.

FIGS. 3-6 show a second embodiment according to the present invention, in which the interior cover 2 is provided with a set of dividers so that separate processing regions can be defined within the inner chamber 48. Specifically, within the interior cover 2, one or more vertically movable splash guards 37, 39. In FIGS. 3-6 two circular splash guards 37 and 39 are shown although it will be appreciated that any desired number of splash guards may be provided and are contemplated by this disclosure, the actual number of splash guards depending in part upon the number of different process fluids which are intended to be separately collected.

The outer splash guard 37 is positioned concentrically about the inner splash guard 39. Thus, the inner splash guard 39 defines an inner process fluid collector within its interior. A middle process fluid collector is defined by an annular region formed between the outer surface of the inner splash guard 39 and the inner surface of the outer splash guard 37. An outer process fluid collector is defined by an annular region formed between the outer surface of the outer splash guard 37 and the inner surface of the cylindrical wall 21.

Figure 3:
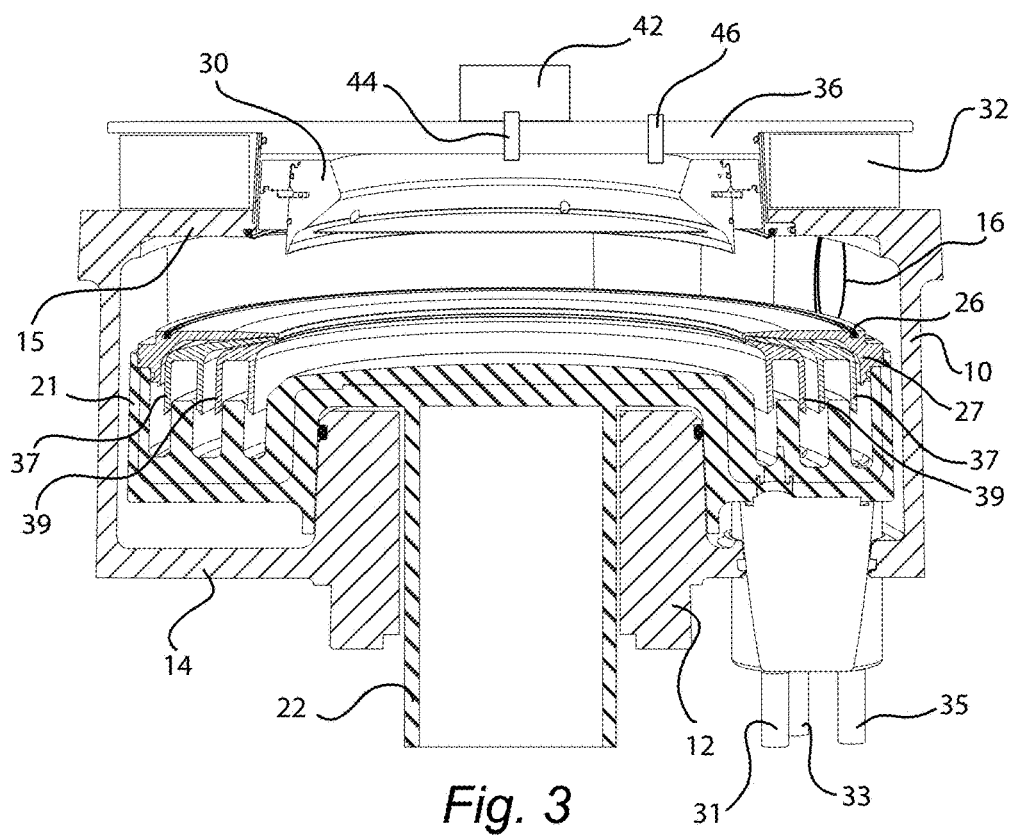
FIG. 3 is an explanatory cross-sectional side view of a process chamber according to a second embodiment of the invention, with the interior cover shown in its first position.

Associated with each such fluid collector a drain is provided for delivering collected process media from the respective fluid collector to outside the closed process chamber. As shown in FIG. 3, drains 31, 33 and 35 each extend through the base 20 of the interior cover, and also through the bottom wall 14 of the main chamber 1. The assembly of drains 31, 33 and 35 is associated with bottom wall 14 via a dynamic seal as described above, to permit relative movement of the drain lines and the outer chamber 1 while the interior cover 2 is moved, while maintaining a gas-tight seal.

Deflector 27 in this embodiment is somewhat elongated to accommodate the upper portions of splash guards 37 and 39, but is otherwise as described above in connection with the first embodiment.

Splash guards 37 and 39 are moved up and down relative to interior cover 2 by suitable actuators such as pneumatic cylinders, combinations of pneumatic and hydraulic cylinders, linear motors, Bowden wires or the like. Although not shown in the accompanying drawings, the actuators for splash guards 37 and 39 are similarly mounted traversing bottom wall 14 via a dynamic seal.

Each splash guard is independently movable in the vertical direction. Accordingly, each splash guard can selectively be raised and/or lowered relative to the rotary chuck 30, relative to any other splash guard, and relative to the interior cover 2, such that excess process fluid emanating from the trailing edge of the rotary chuck 30 is directed toward a selected fluid collector.

Figure 4:
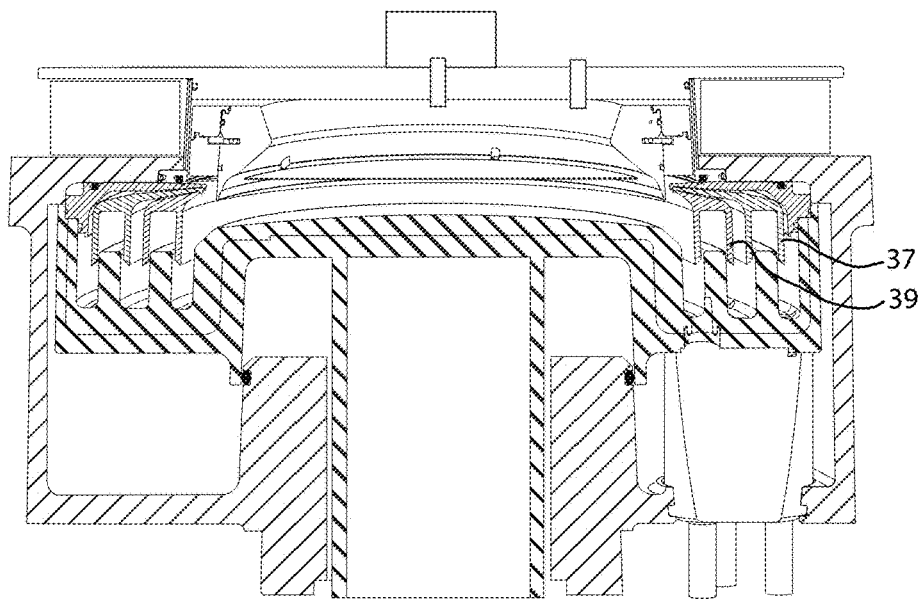
FIG. 4 is an explanatory cross-sectional side view of a process chamber according to the second embodiment of the invention, with the interior cover shown in its second position and with the splash guards in a first configuration.

In FIGS. 3 and 4, both splash guards 37 and 39 are shown in an elevated status, such that, in the working position depicted in FIG. 4, excess process fluid emanating from the trailing edge of the rotary chuck 30 is directed against the inner surface of the inner splash guard 39 and into the inner fluid collector 31. Thus, excess fluid from the surface of a wafer undergoing processing can be selectively recovered through drain 31 and optionally recycled or reused.

Figure 5:
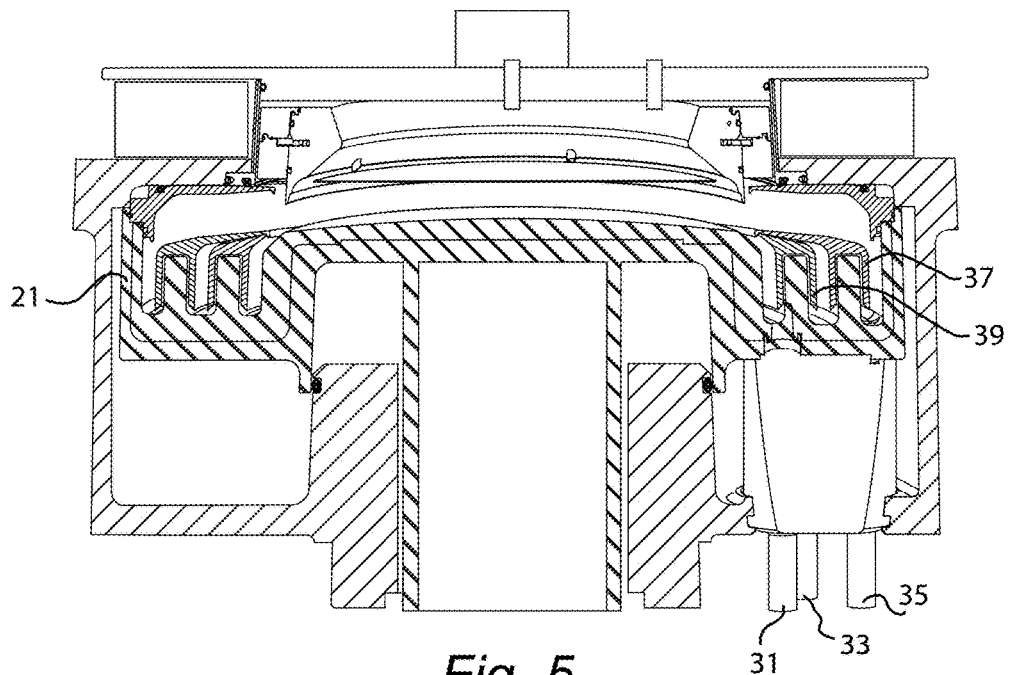
FIG. 5 is an explanatory cross-sectional side view of a process chamber according to the second embodiment of the invention, with the interior cover shown in its second position and with the splash guards in a second configuration.

In FIG. 5, both splash guards 37 and 39 are in their upper lower relative to interior cover 2, with interior cover 2 being in its second or closed position. In this configuration, excess process fluid emanating from the trailing edge of the rotary chuck 30 is directed against the inner surface of the cylindrical wall 21 and into the outer fluid collector 35. Thus, excess fluid from the surface of a wafer undergoing processing can be selectively recovered through drain 35 and optionally recycled or reused.

Figure 6:
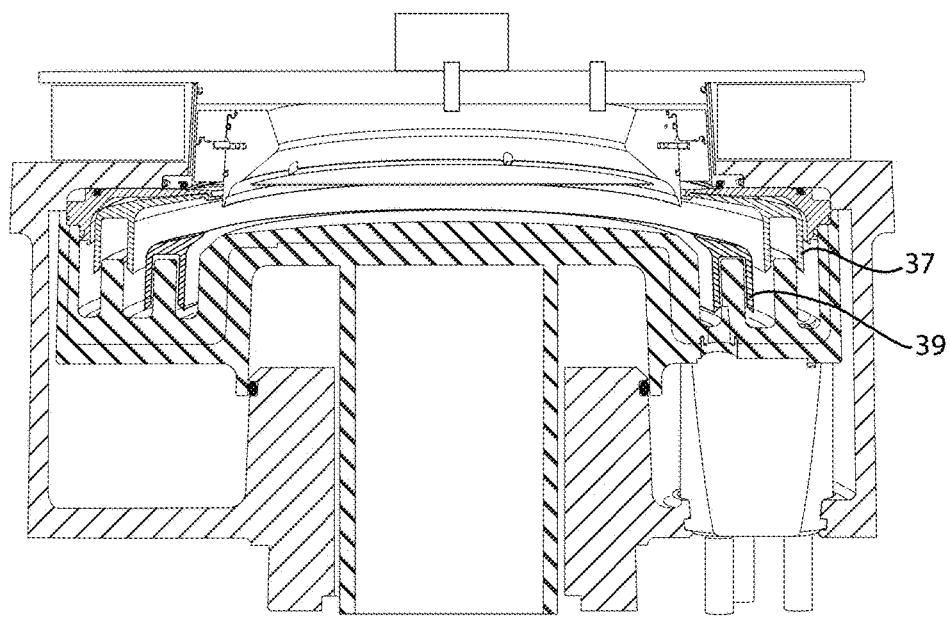
FIG. 6 is an explanatory cross-sectional side view of a process chamber according to the second embodiment of the invention, with the interior cover shown in its second position and with the splash guards in a third configuration.

In FIG. 6, splash guard 39 is in its lower position while splash guard 37 is in its upper position relative to interior cover 2, with interior cover 2 being in its second or closed position. In this configuration, excess process fluid emanating from the trailing edge of the rotary chuck 30 is directed against the inner surface of the outer splash guard 37 and into the middle fluid collector 33. Thus, excess fluid from the surface of a wafer undergoing processing can be selectively recovered through drain 33 and optionally recycled or reused.

Figure 7:
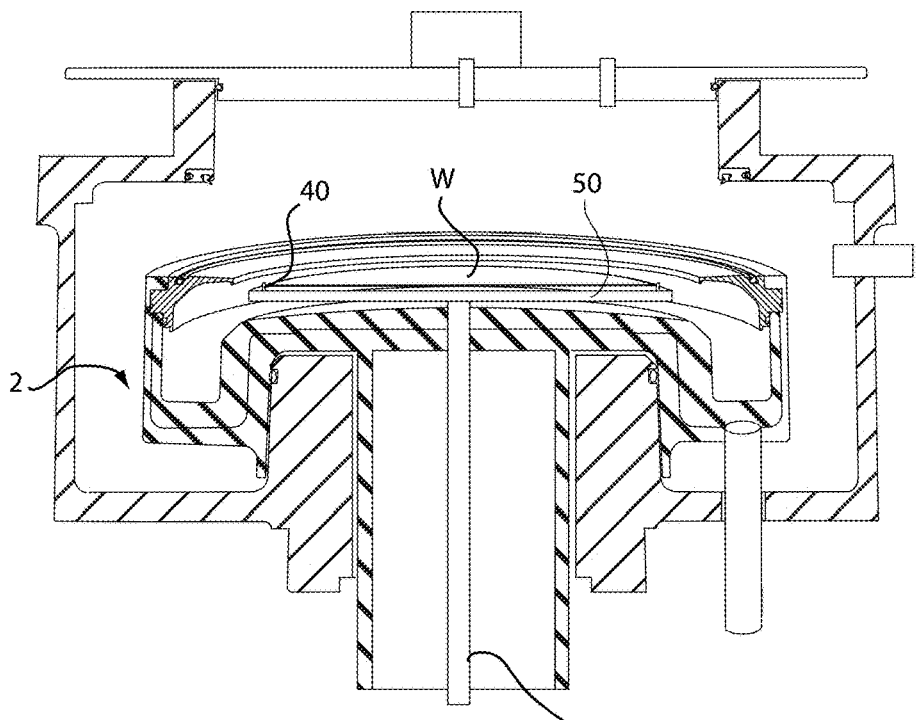
FIG. 7 is an explanatory cross-sectional side view of a process chamber according to a third embodiment of the invention, with the interior cover shown in its first position.
Figure 8:
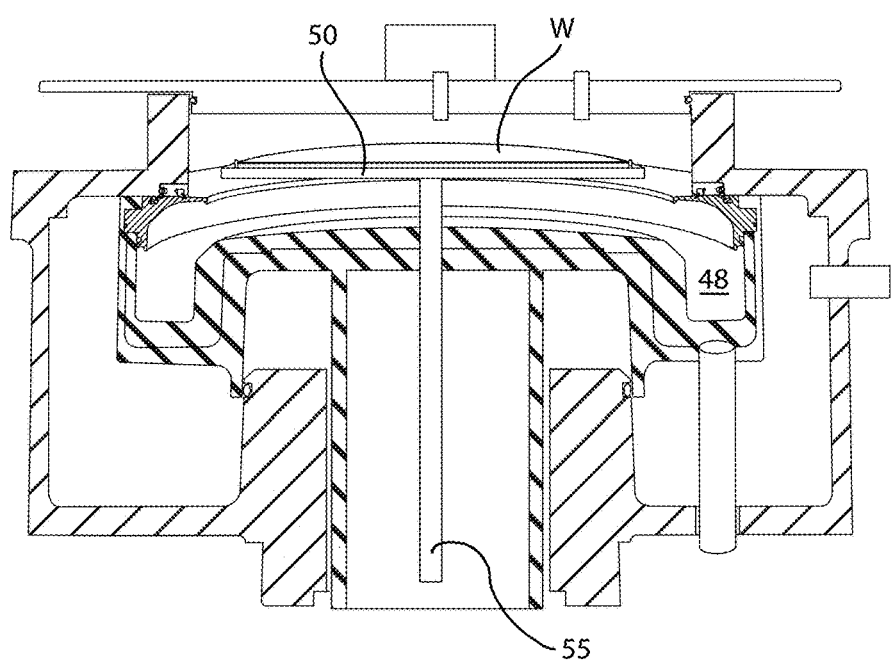
FIG. 8 is an explanatory cross-sectional side view of a process chamber according to the third embodiment of the invention, with the interior cover shown in its second position.

FIGS. 7 and 8 show a third embodiment of the present invention, in which the chamber design of the first embodiment is adapted for use with a spin chuck in which a wafer W is mounted on an upper side of a chuck that is rotated through the action of a motor on a central shaft.

In particular, wafer W is loaded onto spin chuck 50 when interior cover 2 is in the loading/unloading position depicted in FIG. 7, and wafer W is secured in the predetermined orientation relative to chuck 50 by gripping members 40. Interior cover 2 is then moved to its second position, as described above in connection with the first embodiment, to define the inner chamber 48.

In this embodiment, it will be seen that spin chuck 50 is also vertically moveable relative to the interior cover 2, so that it can be raised to an optimum processing position within the chamber 48. Spin chuck 50 is then rotated by a motor (not shown) acting upon shaft 55.

Figure 9:
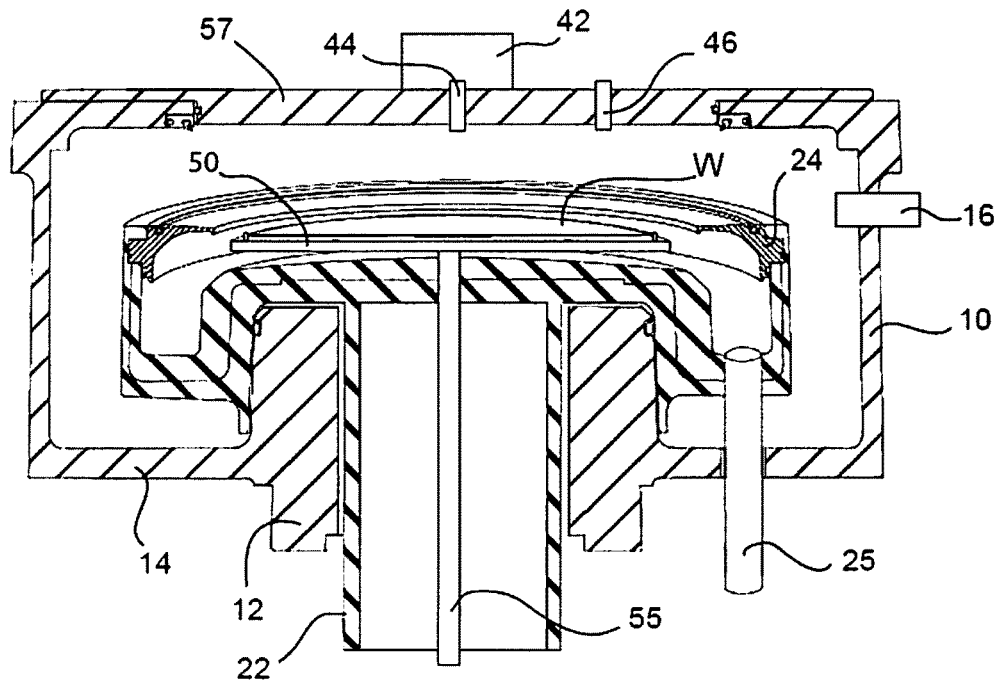
FIG. 9 is an explanatory cross-sectional side view of a process chamber according to a fourth embodiment of the invention, with the interior cover shown in its first position.
Figure 10:
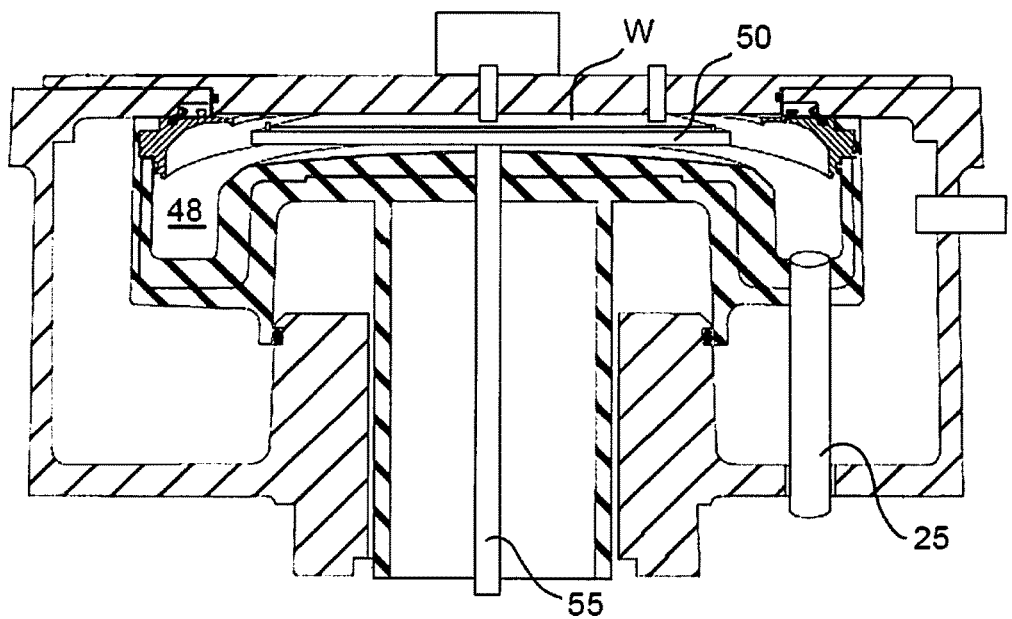
FIG. 10 is an explanatory cross-sectional side view of a process chamber according to the fourth embodiment of the invention, with the interior cover shown in its second position.

FIGS. 9 and 10 show a fourth embodiment of the present invention, in which the spin chuck 50 of the preceding embodiment rotates relative to interior cover 2, but does not move axially relative to the interior cover 2.

Thus, wafer W is loaded onto spin chuck 50 with interior cover 2 is in the loading/unloading position depicted in FIG. 9, and wafer W is secured in the predetermined orientation relative to chuck 50 by gripping members 40. Interior cover 2 is then moved to its second position as depicted in FIG. 10 and as described above in connection with the first embodiment, to define the inner chamber 48.

As the spin chuck 50 of this embodiment is not vertically moveable relative to the interior cover 2, the movement of the interior cover 2 serves simultaneously to position wafer W at its final processing position within the chamber 48. Spin chuck 50 is then rotated by a motor (not shown) acting upon shaft 55.

What is claimed is:

1. A device for processing wafer-shaped articles, comprising:
   an upper chamber structure that surrounds and supports a rotary chuck, said rotary chuck being adapted to hold a wafer shaped article thereon; and
   a cover disposed beneath said upper chamber structure and said rotary chuck, said cover comprising at least one drainage channel and a liquid outlet communicating with said at least one drainage channel,
   said cover being movable relative to said upper chamber structure and said rotary chuck between:
   a first position in which an annular deflector member that extends upwardly above said at least one drainage channel does not seal against a facing surface of said upper chamber structure adjacent said rotary chuck, and
   a second position in which said annular deflector member seals against an inner surface of said upper chamber structure adjacent said rotary chuck to define a gas-tight process chamber.

2. The device according to claim 1, wherein said cover comprises a base and at least one upstanding wall, said base being connected to a shaft that penetrates said cover via a seal that permits relative movement between said shaft and said cover while maintaining gas tightness of said gas-tight process chamber.

3. The device according to claim 2, further comprising a fluid medium inlet traversing the base of the cover, so that process fluids may be introduced into the gas-tight chamber onto a downwardly facing surface of a wafer.

4. The device according to claim 1, wherein said cover comprises a plurality of splash guards that are independently axially displaceable relative to said cover, said splash guards and said cover being adapted to define a plurality of distinct processing regions within said gas-tight chamber when said cover is in said second position.

5. The device according to claim 4, wherein each of said distinct processing regions comprises a respective liquid discharge pipe in fluid communication therewith.

6. The device according to claim 4, wherein each axially displaceable splash guard is selectively driven from outside the gas-tight process chamber to a predefined vertical position.

7. The device according to claim 4, wherein each axially displaceable splash guard is selectively positionable so as to capture a preselected process fluid emanating from a spinning wafer carried by said rotary chuck.

8. The device according to claim 1, wherein said rotary chuck is adapted to be driven without physical contact through a magnetic bearing, and wherein said rotary chuck and said cover are vertically movable relative to each other.

9. The device according to claim 8, wherein said magnetic bearing comprises a stator located outside the gas-tight process chamber.

10. The device according to claim 1, further comprising a pipe connecting said at least one drainage channel and said liquid outlet, said pipe being rigidly mounted to a base of said cover, the pipe traversing a bottom wall of said upper chamber structure via a dynamic seal that allows said pipe to slide axially relative to said bottom wall while maintaining a gas-tight seal when said cover moves between said first and second positions.

11. A device for processing wafer-shaped articles, comprising:
    an upper chamber structure that surrounds and supports a rotary chuck, said rotary chuck being adapted to hold a wafer shaped article thereon; and
    a cover disposed beneath said upper chamber structure and said rotary chuck, said cover comprising at least one drainage channel and a liquid outlet communicating with said at least one drainage channel,
    said cover being mounted for movement between:
    a first position in which said cover does not seal against a facing surface of said upper chamber structure adjacent said rotary chuck, and
    a second position in which said cover seals against an inner surface of said upper chamber structure adjacent said rotary chuck to define a gas-tight process chamber.

12. The device according to claim 11, wherein said cover comprises a base and at least one upstanding wall, said base being connected to a shaft that penetrates said cover via a seal that permits relative movement between said shaft and said cover while maintaining gas tightness of said gas-tight process chamber.

13. The device according to claim 12, further comprising a fluid medium inlet traversing the base of the cover, so that process fluids may be introduced into the gas-tight chamber onto a downwardly facing surface of a wafer.

14. The device according to claim 11, wherein said cover comprises a plurality of splash guards that are independently axially displaceable relative to said cover, said splash guards and said cover being adapted to define a plurality of distinct processing regions within said gas-tight chamber when said cover is in said second position.

15. The device according to claim 14, wherein each of said distinct processing regions comprises a respective liquid discharge pipe in fluid communication therewith.

16. The device according to claim 14, wherein each axially displaceable splash guard is selectively driven from outside the gas-tight process chamber to a predefined vertical position.

17. The device according to claim 14, wherein each axially displaceable splash guard is selectively positionable so as to capture a preselected process fluid emanating from a spinning wafer carried by said rotary chuck.

18. The device according to claim 11, wherein said rotary chuck is adapted to be driven without physical contact through a magnetic bearing, and wherein said rotary chuck and said cover are vertically movable relative to each other.

19. The device according to claim 18, wherein said magnetic bearing comprises a stator located outside the gas-tight process chamber.

* * * * *